United States Patent
Gohou

(10) Patent No.: US 7,349,238 B2
(45) Date of Patent: Mar. 25, 2008

(54) FERROELECTRIC MEMORY DEVICE

(75) Inventor: Yasushi Gohou, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 79 days.

(21) Appl. No.: 11/491,267

(22) Filed: Jul. 24, 2006

(65) Prior Publication Data

US 2007/0053220 A1    Mar. 8, 2007

(30) Foreign Application Priority Data

Sep. 7, 2005    (JP)    ............... 2005-259766

(51) Int. Cl.
*G11C 11/22*    (2006.01)
(52) U.S. Cl. .................. 365/145; 365/51; 365/52
(58) Field of Classification Search ........ 365/145, 365/51, 52
See application file for complete search history.

(56) References Cited

U.S. PATENT DOCUMENTS

| | | | |
|---|---|---|---|
| 5,297,077 A | 3/1994 | Imai et al. | |
| 5,455,786 A | 10/1995 | Takeuchi et al. | |
| 5,726,930 A | 3/1998 | Hasegawa et al. | |
| 5,761,733 A * | 6/1998 | Miyauchi | 711/164 |
| 5,768,182 A | 6/1998 | Hu et al. | |
| 5,828,596 A | 10/1998 | Takata et al. | |
| 5,910,911 A | 6/1999 | Sekiguchi et al. | |
| 6,434,038 B1 * | 8/2002 | Ohno | 365/145 |
| 7,120,041 B2 * | 10/2006 | Kang | 365/78 |
| 2007/0211512 A1 * | 9/2007 | Shuto | 365/145 |

FOREIGN PATENT DOCUMENTS

JP    3-5996 A    1/1991

* cited by examiner

*Primary Examiner*—Anh Phung
(74) *Attorney, Agent, or Firm*—McDermott Will & Emery LLP

(57) ABSTRACT

An operation switch circuit receives a command specifying operational specifications from a host. An operation control circuit controls the time of voltage application to a plate line based on an output signal from the operation switch circuit, to attain volatile-mode operation in a first memory region and nonvolatile-mode operation in a second memory region, for example.

9 Claims, 5 Drawing Sheets

FERROELECTRIC MEMORY DEVICE

BACKGROUND OF THE INVENTION

The present invention relates to a nonvolatile memory device, and more particularly, to a memory device using a ferroelectric material.

Ferroelectric memory is nonvolatile memory utilizing a feature that polarization generated along the direction of an electric field applied to a ferroelectric film remains even after removal of the electric field. Such memory is finding applications as nonvolatile memories for IC cards and the like that require high speed and a large number of times of rewrite in encryption processing and the like.

FIG. 7 is a circuit diagram of a ferroelectric memory cell. In FIG. 7, WL denotes a word line, BL a bit line, MT a selection transistor that is a MOS transistor, MC a ferroelectric capacitor, PL a plate line, and SN a storage node. One electrode constituting the ferroelectric capacitor MC, that is, the plate line PL is shared with a ferroelectric capacitor of another memory cell. The other electrode of the ferroelectric capacitor MC, that is, the storage node SN is connected to the source electrode of the selection transistor MT. The gate electrode and drain electrode of the selection transistor MT are connected to the word line WL and the bit line BL, respectively.

FIG. 8 shows a hysteresis characteristic representing the polarization characteristic of the ferroelectric capacitor MC, in which the x-axis represents the voltage V and the y-axis represents the polarization Q.

FIG. 9 is a control timing chart in one cycle of the ferroelectric memory cell of FIG. 7. It is assumed in this chart that another ferroelectric capacitor sharing the plate line PL is connected to a complementary bit line /BL and that a sense amplifier is further provided which is activated with a signal SAE and amplifies the potential difference between the bit lines BL and /BL.

The operation of the ferroelectric memory will be described with reference to FIGS. 8 and 9. At time t0, data "1" and "0" are respectively in the states of point a and point e in FIG. 8. At time t1, a voltage Vcc is applied to the plate line PL, and at time t2, data "1" and "0" have respectively moved to the states of point b and point f. At time t3, the sense amplifier is started, and at time t4, data "1" and "0" have respectively moved to the states of point c and point g. These states continue until time t5. At time t5, the voltage of the plate line PL is lowered from Vcc to 0 V, and data "1" and "0" have respectively moved to the states of point d and point e. These states continue until time t6. At time t6, at which the driving of the sense amplifier is cut off, data "1" and "0" respectively return to the original states of point a and point e in FIG. 8.

The ferroelectric memory involves destructive read in its read operation, and thus rewrite operation is necessary after read operation. The operation of point c to point d and to point a and the operation of point f to point g and to point e are called rewrite operation. Due to this operation, the ferroelectric film becomes fatigued, and thus a limitation similar to that on the number of times of rewrite is also imposed on the number of times of read.

To solve the problem of deterioration of the life due to fatigue, a ferroelectric memory called shadow RAM has been proposed. The shadow RAM operates in volatile mode like DRAM during normal operation, and converts volatile information to nonvolatile information at the time of power-off while converting nonvolatile information to volatile information at the time of power-on.

In Japanese Laid-Open Patent Publication No. 3-5996 and U.S. Pat. No. 5,297,077, nonvolatile mode and volatile mode are established by changing the potential at a plate line or the drive method thereof.

In U.S. Pat. No. 5,455,786, a plate line is held at the same potential in both nonvolatile mode and volatile mode so that volatile write also serves as nonvolatile write, and that polarization reversal can be effectively prevented during read in the volatile mode. During the time of power-off, the potential at the plate line is speedily dropped.

In U.S. Pat. No. 5,910,911, while a plate line is held at the same potential in both nonvolatile mode and volatile mode, the data amplitude at a bit line is made large in the nonvolatile mode and small in the volatile mode.

The shadow RAM technology described above has the following problems. It is necessary to covert volatile information to nonvolatile information at the time of power-off and convert nonvolatile information to volatile information at the time of power-on. Also, since the power supply voltage decreases with achievement of finer process rules, it is becoming difficult to establish a polarized state with write under an electric field lower than a coercive electric field.

SUMMARY OF THE INVENTION

An object of the present invention is providing a ferroelectric memory device that requires no special operation at the time of power-on and power-off and is adaptive even to a fine process.

To attain the above object, in the ferroelectric memory device according to the present invention, the memory region composed of cells identical in configuration is divided into a memory region for volatile-mode operational specifications and a memory region for nonvolatile-mode operational specifications. These operational specifications are different from each other in cycle time, and such difference is attained by controlling the time of voltage application to plate lines.

To state more specifically, the ferroelectric memory device according to the present invention comprises: a memory region divided into first and second regions subjected to read/write of data according to first and second operational specifications different from each other; an operation switch circuit for determining which to select, the first operational specifications or the second operational specifications; and an operation control circuit for changing operation control based on a signal output from the operation switch circuit. The difference between the first operational specifications and the second operational specifications is a difference in cycle time, more specifically, a difference in the time of voltage application across the capacitor.

The ferroelectric memory device according to the present invention, provided with the operation switch circuit and the operation control circuit, permits simple and high-speed switching between operational specifications. Also, by controlling the time of voltage application to a plate line, switching between volatile mode and nonvolatile mode is permitted, and thus the number of times of read/write can be increased.

DESCRIPTION OF THE PREFERRED EMBODIMENTS

Figure 1:
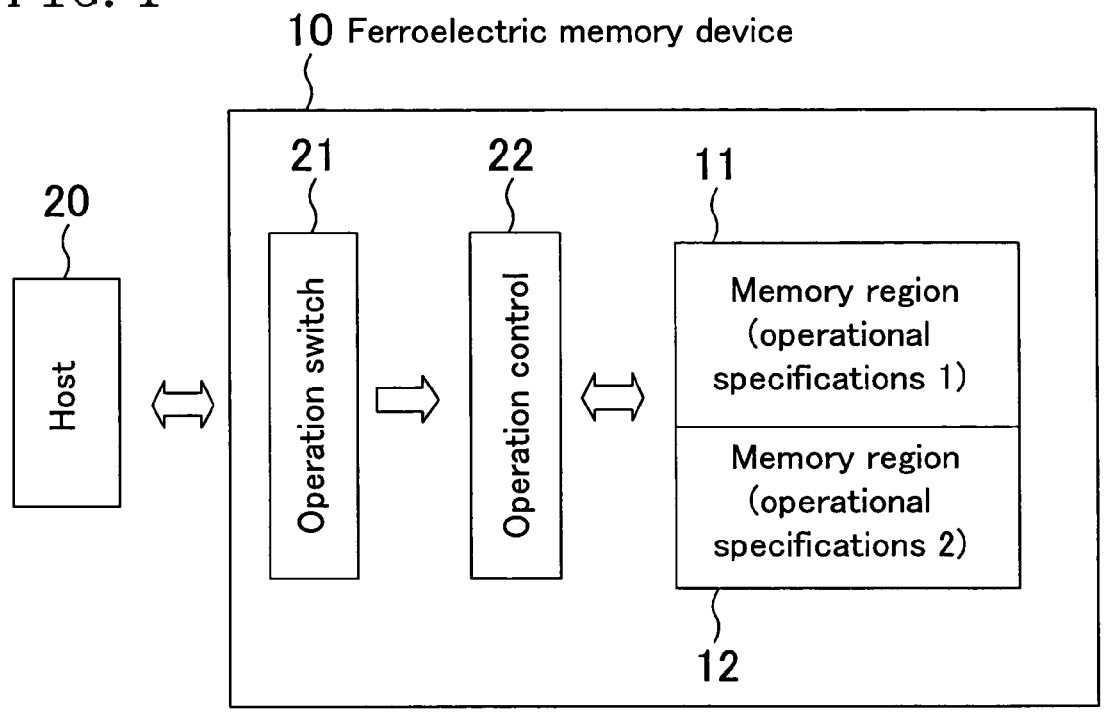
FIG. 1 is a block diagram of a ferroelectric memory device of Embodiment 1 of the present invention.
Figure 7:
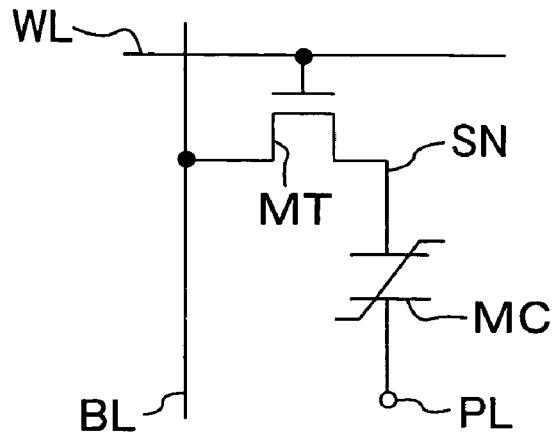
FIG. 7 shows a configuration of a memory cell in a conventional ferroelectric memory device.

FIG. 1 is a block diagram of a ferroelectric memory device of Embodiment 1 of the present invention. In FIG. 1, the reference numeral 10 denotes a ferroelectric memory device and 20 a host for controlling the ferroelectric memory device 10. The ferroelectric memory device 10 includes a memory region 11 for operational specifications 1, a memory region 12 for operational specifications 2, an operation switch circuit 21 adaptive to switching between the operational specifications 1 and 2, and an operation control circuit 22 for controlling write/read operation for the ferroelectric memory. The first and second memory regions 11 and 12 have memory cells identical in configuration to that of FIG. 7.

Referring to FIG. 1, when a command based on the operational specifications 1 is supplied from the host 20 to the ferroelectric memory device 10, the operation switch circuit 21 of the ferroelectric memory device 10 outputs a selection signal for the operational specifications 1 to the operation control circuit 22. The operation control circuit 22 then executes write or read for the memory region based on the operational specifications 1. In this way, the memory region subjected to the write or read according to the operational specifications 1 serves as the first memory region 11. Likewise, when a command based on the operational specifications 2 is supplied from the host 20 to the ferroelectric memory device 10, write or read is executed based on the operational specifications 2, and the memory region subjected to the write or read serves as the second memory region 12.

As described above, in this embodiment, the ferroelectric memory device 10 is provided with the operation switch circuit 21 for determining the operational specifications and the operation control circuit 22 for changing the operation control based on the output signal from the operation switch circuit 21. Having these circuits, the ferroelectric memory device 10 of this embodiment can achieve switching between the memory region 11 for the operational specifications 1 and the memory region 12 for the operational specifications 2 under simple and high-speed control while maintaining the existing internal power supply specifications and memory cell configuration.

The difference between the operational specifications 1 and the operational specifications 2 will be described in a concretive manner.

Figure 2:
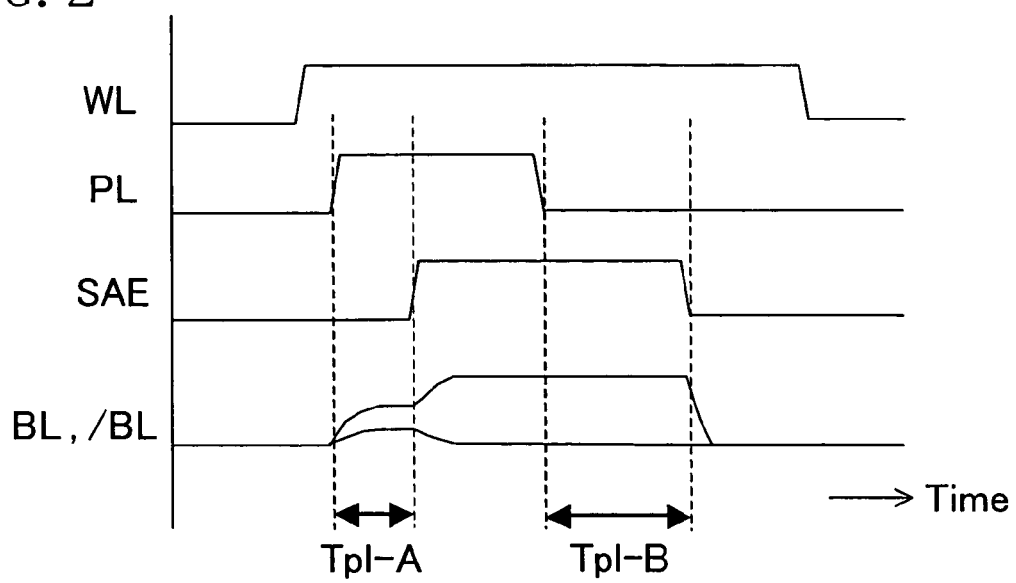
FIG. 2 is a timing chart for defining Tp1-A and Tp1-B.

First, two times Tp1-A and Tp1-B are defined as shown in FIG. 2. Tp1-A is defined as the time from application of "H" voltage to the plate line PL until start of driving of the sense amplifier, which corresponds to the time from t1 to t3 shown in FIG. 9. Tp1-B is defined as the time during which the bit line is being amplified but no voltage is applied to the plate line PL, which corresponds to the time from t5 to t6 shown in FIG. 9.

Figure 3:
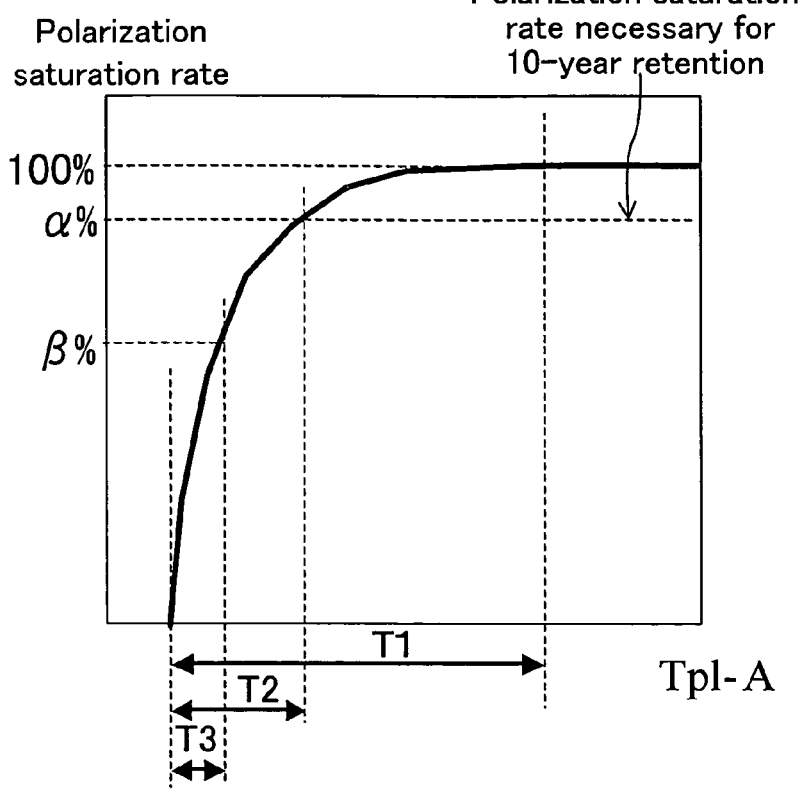
FIG. 3 is a view showing the relationship between Tp1-A and the polarization saturation rate.
Figure 4:
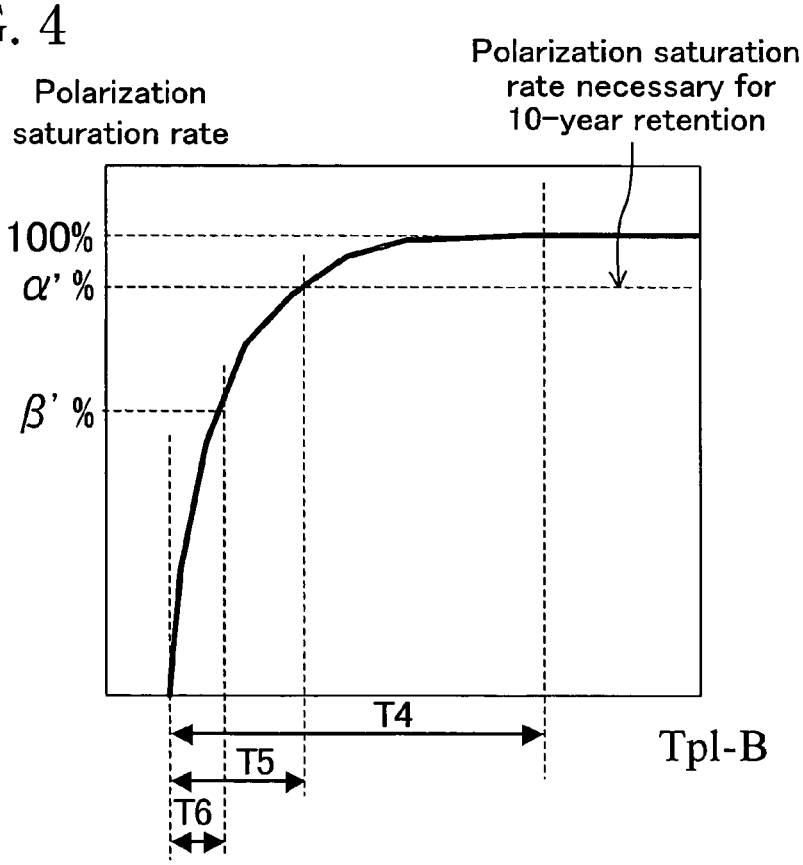
FIG. 4 is a view showing the relationship between Tp1-B and the polarization saturation rate.

FIG. 3 is a graph showing the relationship between Tp1-A and the polarization saturation rate, and FIG. 4 is a graph showing the relationship between Tp1-B and the polarization saturation rate, both of which were obtained experimentally. The polarization saturation rate as used herein refers to the percentage normalized with respect to the polarization amount drawn from the ferroelectric capacitor MC when Tp1-A is equal to a sufficiently long time T1 as 100%, or the percentage normalized with respect to the polarization amount drawn from the ferroelectric capacitor MC when Tp1-B is equal to a sufficiently long time T4 as 100%.

Figure 8:
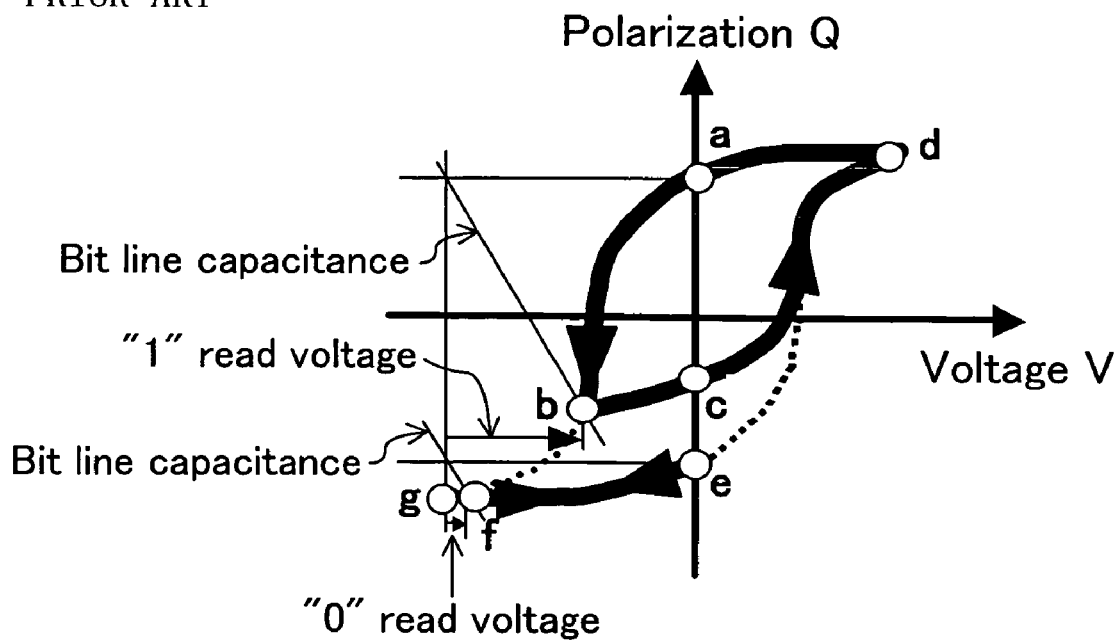
FIG. 8 is a hysteresis characteristic view of the conventional ferroelectric memory device.

As Tp1-A is made shorter, the polarization amount drawn from the ferroelectric capacitor MC that is the potential difference between point b and point f in FIG. 8 decreases, failing to obtain a potential difference between the bit lines BL and /BL required for amplification of read data. The time of Tp1-A in such operation limitation is T3 in FIG. 3, and the polarization saturation rate for this is β%.

Likewise, as Tp1-B is made shorter, the rewrite operation of point c to point d and to point a becomes insufficient. Therefore, the polarization amount will return, not to point a, but to a position lower than point a, causing reduction in the polarization amount for next read, and thus failing to obtain a potential difference between the bit lines BL and /BL required for amplification of read data. Thus, the minimum value of Tp1-B exists, which is T6 in FIG. 4, and the polarization saturation rate for this is β'%.

It is found from the above that any given cycle time can be set as far as Tp1-A is set at T3 or longer and Tp1-B is set at T6 or longer. In other words, the operation control circuit 22 in FIG. 1 may only change the times Tp1-A and Tp1-B based on the output signal from the operation switch circuit 21. By this change, the cycle time can be changed under simple and high-speed control of the time of voltage application to plate lines while the existing internal power supply specifications and memory cell configuration are maintained. Thus, a ferroelectric memory device permitting high-speed read/write can be implemented.

Figure 9:
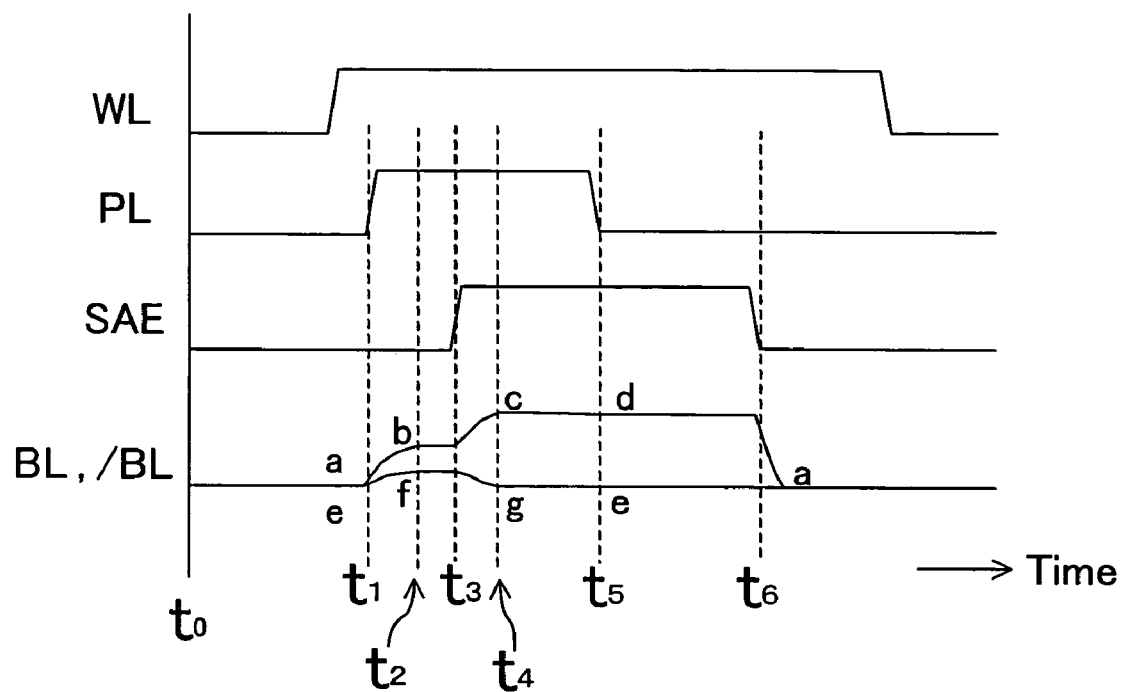
FIG. 9 is an operation timing chart of the conventional ferroelectric memory device.

If Tp1-A is made shorter while the time from t1 to t4 in FIG. 9 is fixed, the time from t3 to t4 in FIG. 9 must be made longer. This extends the time during which the bit lines BL and /BL are held in small amplitude, and thus stabilizes the operation. In reverse, if the time from t3 to t4 in FIG. 9 is made shorter, the time taken until amplification of the bit lines BL and /BL can be shortened. This speeds up the access time for external output. In this way, by controlling Tp1-A, it is possible to implement a ferroelectric memory device that can not only change the cycle time operational specifications but also stabilize the operation or speed up the access time for external output.

If Tp1-B is made shorter, the time during which point d in FIG. 8 is retained is shortened. The ferroelectric capacitor MC is kept applied with an electric field over the time during which point d is retained, and this poses a cause of deterioration. Therefore, by controlling to shorten Tp1-B, it is possible to not only change the cycle time operational specifications but also shorten the stress time for the ferroelectric capacitor MC. Thus, a ferroelectric memory device capable of minimizing capacitor deterioration can be implemented.

Next, a method for providing the nonvolatile mode and the volatile mode will be described.

It has been experimentally confirmed that a correlation exists between the polarization saturation rate shown in FIG. 3 and the retention time as a characteristic of nonvolatile memory. Operation in the volatile mode is permitted as long as Tp1-A is T3 or longer. However, after retention, a phenomenon called relaxation occurs in which point a and point e in FIG. 8 become closer to the origin. Therefore, to secure the polarization amount necessary for ensuring 10-year retention, the polarization saturation rate of α% in FIG. 3 is necessary. In other words, retention of 10 years or longer can be guaranteed when Tp1-A is T2 or longer.

More specifically, in FIG. 3, when the polarization saturation rate is α% or more (Tp1-A is T2 or longer), the retention merit value is 10 years or longer, which corresponds to the nonvolatile mode. On the contrary, when the polarization saturation is β% or more and less than α% (Tp1-A is T3 or longer and shorter than T2), the retention merit value is shorter than 10 years, which corresponds to the volatile mode.

In FIG. 4, as in FIG. 3, when the polarization saturation rate is α'% or more (Tp1-B is T5 or longer), the retention merit value is 10 years or longer, which corresponds to the nonvolatile mode. On the contrary, when the polarization saturation is β'% or more and less than α'% (Tp1-B is T6 or longer and shorter than T5), the retention merit value is shorter than 10 years, which corresponds to the nonvolatile mode.

As described above, by controlling Tp1-A and Tp1-B, it is possible to implement a ferroelectric memory device that can achieve switching between the volatile mode permitting high-speed operation and the nonvolatile mode under simple and high-speed control while maintaining the internal power supply specifications and memory cell configuration.

Figure 5:
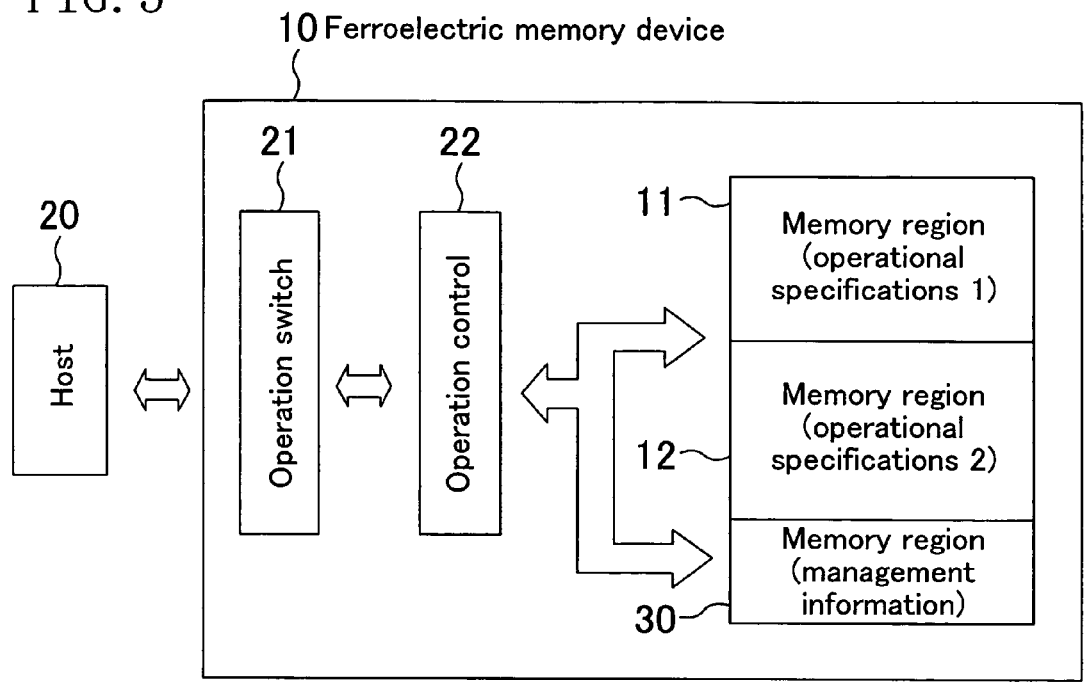
FIG. 5 is a block diagram of a ferroelectric memory device of Embodiment 2 of the present invention.

FIG. 5 is a block diagram of a ferroelectric memory device of Embodiment 2 of the present invention. In FIG. 5, the reference numeral 10 denotes a ferroelectric memory device and 20 a host for controlling the ferroelectric memory device 10. The ferroelectric memory device 10 includes the memory region 11 for operational specifications 1, the memory region 12 for operational specifications 2, the operation switch circuit 21 and the operation control circuit 22, all of which are same in configuration as those in FIG. 1. In this embodiment, a memory region 30 for storing management information data is newly provided. Like the first and second memory regions 11 and 12, the third memory region 30 has memory cells identical in configuration to that of FIG. 7.

Referring to FIG. 5, a command based on the operational specifications 1 or 2 is supplied from the host 20 to the ferroelectric memory device 10, and data is written into the first memory region 11 or the second memory region 12 via the operation switch circuit 21 and the operation control circuit 22, as in Embodiment 1. At this time, management information for identifying the relationship between the memory region and the operational specifications is written into the third memory region 30. In read operation, management information is read from the third memory region 30, to identify the relationship between the memory region and the operational specifications in the ferroelectric memory device 10, and then read operation is executed based on the operational specifications obtained from the management information.

As described above, by providing the third memory region 30 for storing management information, the relationship between the memory region and the operational specifications is clarified. It is therefore possible to prevent an occurrence of executing write/read operation according to wrong operational specifications.

Figure 6:
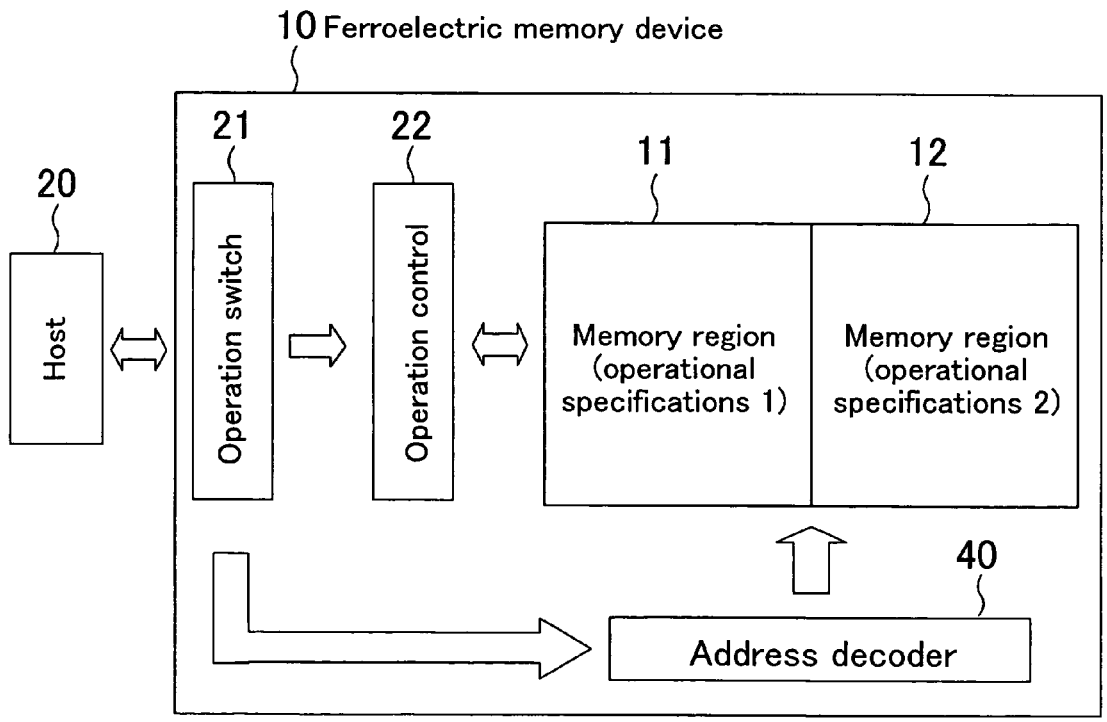
FIG. 6 is a block diagram of a ferroelectric memory device of Embodiment 3 of the present invention.

FIG. 6 is a block diagram of a ferroelectric memory device of Embodiment 3 of the present invention. In FIG. 6, the reference numeral 10 denotes a ferroelectric memory device and 20 a host for controlling the ferroelectric memory device 10. The ferroelectric memory device 10 includes the memory region 11 for operational specifications 1, the memory region 12 for operational specifications 2, the operation switch circuit 21 and the operation control circuit 22, all of which are same in configuration as those in FIG. 1. In this embodiment, an address decoder circuit 40 is newly provided. The address decoder circuit 40 receives a signal for determining the operational specifications output from the operation switch circuit 21.

Referring to FIG. 6, when a command based on the operational specifications 1 is supplied from the host 20 to the ferroelectric memory device 10, a selection signal for the operational specifications 1 is output from the operation switch circuit 21. The selection signal for the operational specifications 1 is input into the operation control circuit 22 and also the address decoder circuit 40. The first memory region 11 is selected by the address decoder circuit 40, and read/write is executed in the manner according to the operational specifications 1. In the case of the operational specifications 2, the second memory region 12 is selected, and read/write is executed in the manner according to the operational specifications 2.

As described above, by providing the address decoder circuit 40, a specific memory region is selected for specific operational specifications. This provides an effect of eliminating the necessity of managing the memory region in which and the operational specifications according to which data is stored.

In the above description, two types of operational specifications were used. Alternatively, three or more types of operational specifications may be used.

In Embodiment 1, the control method in which plate lines were driven was adopted. The ferroelectric memory device according to the present invention can also adopt other control methods such as a control method in which the bit line potential is varied while the plate line potential is fixed, and a control method in which both the plate line potential and the bit line potential are varied, as long as a potential difference is applied across the capacitor and substantially the same effect as that described above can be obtained.

As described above, the ferroelectric memory device according to the present invention is useful as a memory mixed in a system LSI product incorporated in portable equipment and the like, in which image and visual data and the like is stored temporarily in RAM, computation for data compression is made at high speed, and then the resultant data is held in a nonvolatile memory.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A ferroelectric memory device having a plurality of memory cells, each of the memory cells including a capacitor formed of a ferroelectric film, one terminal of the capacitor being connected to a bit line via a selection transistor while the other terminal being connected a plate line, a gate of the selection transistor being connected to a word line, the ferroelectric memory device comprising:

a memory region having the plurality of memory cells, the memory region being divided into a first memory region subjected to read/write of data according to first operational specifications and a second memory region subjected to read/write of data according to second operational specifications different from the first operational specifications;

an operation switch circuit for determining which to select, the first operational specifications or the second operational specifications; and an operation control circuit for changing operation control based on a signal output from the operation switch circuit.

2. The device of claim 1, wherein the difference between the first operational specifications and the second operational specifications is a difference in cycle time.

3. The device of claim 2, wherein the difference between the first operational specifications and the second operational specifications is a difference in the time of voltage application across the capacitor.

4. The device of claim 3, wherein the difference between the first operational specifications and the second operational specifications is a difference in a first time from application of a voltage across the capacitor until start of amplification of a voltage at the bit line.

5. The device of claim 4, wherein the first time of at least the first or second operational specifications is too short to maintain the nonvolatility of the memory cell.

6. The device of claim 3, wherein the difference between the first operational specifications and the second operational specifications is a difference in a second time from application of a voltage across the capacitor in a rewrite direction until termination of amplification of a voltage at the bit line.

7. The device of claim 6, wherein the second time of at least either the first or second operational specifications is too short to maintain the nonvolatility of the memory cell.

8. The device of claim 1, wherein the memory region further comprises a third memory region for storing management information for identifying the relationship between the first and second memory regions and the first and second operational specifications.

9. The device of claim 1, further comprising an address decoder circuit for selecting either the first or second memory region based on the signal output from the operation switch circuit.

* * * * *